US010523185B1

(12) United States Patent
Carvell (10) Patent No.: US 10,523,185 B1
(45) Date of Patent: Dec. 31, 2019

(54) GATE DRIVER POWER SUPPLY

(71) Applicant: BAE Systems Controls Inc., Endicott, NY (US)

(72) Inventor: Paul Carvell, Owego, NY (US)

(73) Assignee: BAE Systems Controls Inc., Endicott, NY (US)

( * ) Notice: Subject to any disclaimer, the term of this patent is extended or adjusted under 35 U.S.C. 154(b) by 0 days.

(21) Appl. No.: 16/042,541

(22) Filed: Jul. 23, 2018

(51) Int. Cl.
  *H03K 7/08* (2006.01)
  *H03K 3/017* (2006.01)
  *H03K 17/08* (2006.01)

(52) U.S. Cl.
  CPC ............. *H03K 3/017* (2013.01); *H03K 17/08* (2013.01)

(58) Field of Classification Search
  CPC ....................................... H03K 17/08
  See application file for complete search history.

(56) References Cited

U.S. PATENT DOCUMENTS 8,692,587 B1 * 4/2014 Dijk ................. H03K 17/06
  326/83
8,867,431 B2 * 10/2014 Kim .................. H04B 7/155
  370/315

* cited by examiner

*Primary Examiner* — Hai L Nguyen
(74) *Attorney, Agent, or Firm* — Scully Scott Murphy & Presser PC (57) ABSTRACT

A power supply for a gate driver circuit is provided. The power supply is configured to supply a logic voltage, a positive voltage and a negative voltage to the gate driver circuit such that a gated semiconductor driven by the gate driver circuit does not inadvertently turn on. The gate driver power supply is configured such that the logic voltage becomes a steady-state voltage prior to the positive voltage becoming a steady-state voltage and remains above a first voltage value until the positive voltage is less than a second voltage value.

16 Claims, 5 Drawing Sheets

GATE DRIVER POWER SUPPLY

FIELD OF THE DISCLOSURE

This disclosure relates to electronic circuits. More specifically, this disclosure relates to a power supply for a gate driver circuit.

BACKGROUND

A gate driver circuit is used to charge a gate of a semiconductor, such as a gated semiconductor. Gated semiconductors include an insulated-gate bipolar transistor (IGBT) and metal-oxide semiconductor field-effect transistor (MOSFET). A gate driver circuit uses a dedicated power source to amplify a signal, such as a pulse-width modulation (PWM) signal in order to control a gated semiconductor via its gate.

A typical dedicated power source for the gate driver circuit will provide a working voltage, e.g., logic voltage and positive voltage and negative voltage. The values of the same over time are important to the performances of the gate driver circuit and the gated semiconductor being driven. For example, depending on the values of the respective voltages at a given time, the gated semiconductor might inadvertently turn on.

SUMMARY

Accordingly, disclosed is a power supply for a gate driver circuit configured to supply a logic voltage, positive voltage and a negative voltage to the gate driver circuit such that a gated semiconductor driven by the gate driver circuit does not inadvertently turn on, especially during power up.

In another aspect of the disclosure, the power supply for a gate driver circuit is further configured to supply a boost voltage to the gate driver circuit.

The gate driver power supply comprises a power source, a full bridge rectifier, a series linear regulating circuit, a first shunt regulating circuit, a second shunt regulating circuit and a diode. The power source is coupled to a primary winding of a transformer via at least two complementary switches. The full bridge rectifier is coupled to a secondary winding of the transformer. The first shunt regulating circuit is coupled to a logic supply line and the full bridge rectifier. The series linear regulating circuit is coupled to the logic supply line, the first shunt regulating circuit and the full bridge rectifier. The first shunt regulating circuit and the series linear regulating circuit regulates the logic voltage on the logic supply line. The second shunt regulating circuit is coupled to the full bridge rectifier, a ground and a positive voltage line. The diode has a first terminal coupled to the logic supply line and a second terminal coupled to a negative supply line.

The series linear regulating circuit comprises a transistor, a first resistive divider and a MOSFET or a bipolar junction transistor (BJT). The base of the transistor is coupled to the logic supply line, and the collector of the transistor is coupled to the gate of the MOSFET or base of the BJT. The source of the MOSFET or emitter of the BJT is coupled to the logic supply line.

The series linear regulating circuit is configured such that the logic voltage becomes a steady-state voltage prior to the positive voltage becoming a steady-state voltage.

The gate driver power supply is configured such that the logic voltage remains above a first voltage value until the positive voltage is less than a second voltage value.

DETAILED DESCRIPTION

Figure 1:
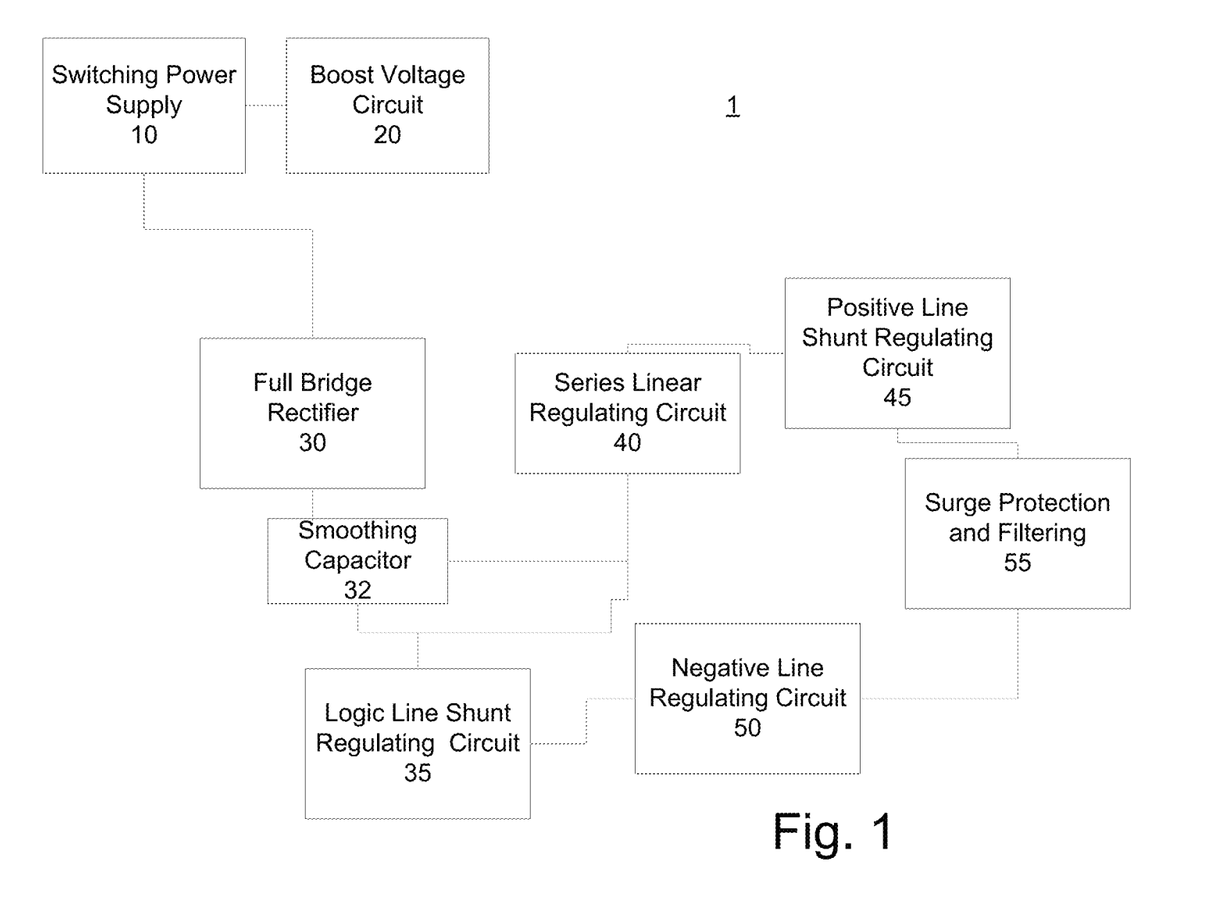
FIG. 1 is a block diagram of certain components of a gate driver power supply in accordance with aspects of the disclosure.

FIG. 1 is a block diagram of certain components of a gate driver power supply 1 in accordance with aspects of the disclosure. The gate driver power supply 1 is a DC to DC converter converting an input DC voltage into more than one DC output voltages. In aspects of the disclosure, the gate driver power supply 1 may output a logic voltage, a positive voltage and a negative voltage. Where needed, the gate driver power supply 1 may also output a boost voltage. The boost voltage may be used where a gate driver circuit is driving a large semiconductor device. Therefore, the boost voltage circuit 20 depicted in FIG. 1 is optional.

The gate driver power supply 1 comprises a switching power supply 10, a full bridge rectifier 30, a smoothing capacitor 32, a series linear regulating circuit 40 (pull-down circuit), a logic line shunt regulating circuit 35, a positive line shunt regulating circuit 45, a negative line regulating circuit 50 and surge protection and filtering 55.

Figure 2:
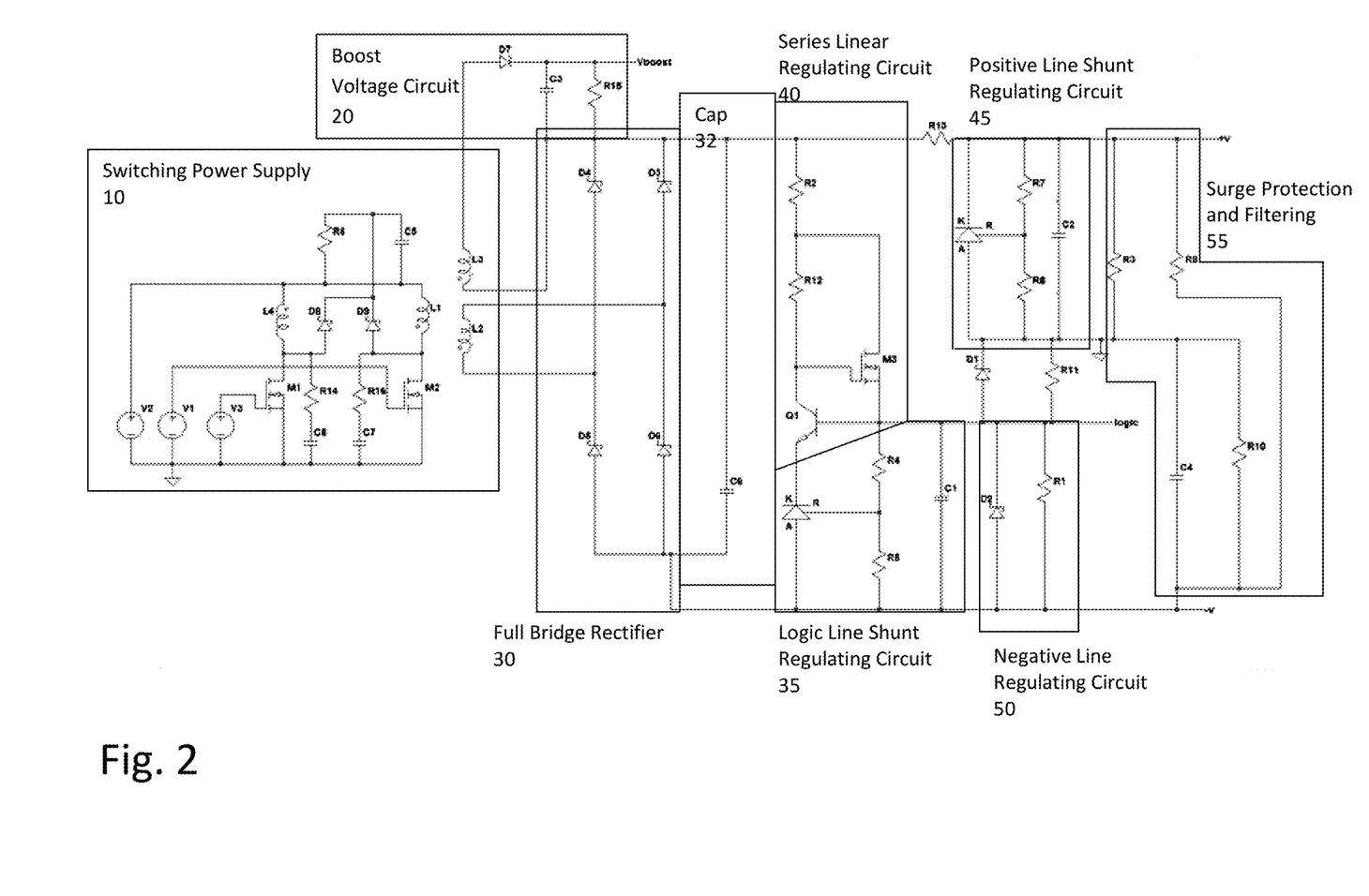
FIG. 2 is a schematic diagram of an example of a gate driver power supply in accordance with aspects of the disclosure.

Each of the above-blocks will be described with reference to an example of the gate driver power supply 1 in accordance with aspects of the disclosure, which is depicted in FIG. 2.

The switching power supply 10 comprises an input voltage (V2). The input voltage (V2) is a DC voltage. The switching power supply 10 further comprises two switches, e.g., MOSFETS M1 and M2. The MOSFETS are biased to be in the switching region of operation. Other types of switches may be used to achieve the switching. The switching operates in a complimentary fashion, where when M1 is turned ON M2 is turned OFF and vice versa. However, both M1 and M2 may be OFF. The switching is controlled by inputs into the gates of M1 and M2. A voltage V3 is supplied to the gate of M1 and a voltage V2 is supplied to the gate of M2. The voltages V2 and V3 are pulsed on/off at a preset duty cycle.

In other aspects of the disclosure, more than two switches may be used. For example, one or both of M1 and M2 may be replaced with a group of switches in parallel. For example, multiple MOSFETS may be connected in parallel where the same drive signal into the gates is used so that the switches would turn ON and OFF at the same time. The drains of each MOSFET would be all connected together. Additionally, the sources of each MOSFET would be all connected together. In an aspect of the disclosure, a respective gate resistor may connect to the gate of each MOSFET in series. The resistance value of each respective gate resistor may be the same. For example, a 10Ω resistor may be used.

The switching power supply 10 further comprises a power transformer (e.g., L1-L4). The primary side of the transformer comprises two coils L1 and L4. The coils have opposite polarity. L1 is coupled to one of the switches, e.g., M2 and L4 is coupled to the other of the switches, e.g. M1. In an aspect of the disclosure, the inductance of the primary windings is the same.

The switching power supply 10 further comprises snubber circuits for suppression of transients which result from the switching of M1 and M2. R14 and C8 form one snubber circuit across M1 and R16 and C7 form another snubber circuit across M2. In an aspect of the disclosure, the resistance values for R14 and R16 are the same and the values of the capacitors are the same.

The switching power supply 10 further comprises additions snubber circuits or clamping circuits for suppression of voltage spikes causes of leakage inductances L1 and L4, primary windings. For example, diodes in combination with a resistor and capacitor may be used. The diode may be a Schottky rectifier diode. As depicted in FIG. 2, D9, R6 and C5 provide one snubber or clamping circuit for L1 and D8, R6 and C5 form another snubber or clamping circuit for L4. In an aspect of the disclosure, the same diode may be used for both D8 and D9.

The power transformer has at least one secondary winding, e.g., L2. When a boost voltage is needed, a second secondary winding is included (as shown in FIG. 2, e.g., L3). The ratio of primary windings to second windings is set based on the required output voltages and the input voltage.

The switching power supply 10 provides an AC voltage. The power supply 1 further comprises a full bridge rectifier 30 and smoothing capacitor 32 (shown in FIG. 2 as C6). The voltage is rectified by the full bridge rectifier 30 and smoothed to provide a DC voltage to the remaining components of the power supply 1. The full bridge rectifier 30 may comprise four Schottky rectifier diodes (e.g., D3-D6). The capacitor 32 removes the pulsating effect and a smooth DC voltage is obtained.

The power supply 1 further comprises a series linear regulating circuit 40. The series linear regulating circuit 40 allows the logic voltage to rise to a steady state value (nominal value) before the positive voltage may rise to its steady state value (nominal value). In other words, during turn on of the power supply 1, the logic rapidly charges. Additionally, during turn off, the series linear regulating circuit 40 maintains the logic supply voltage above a voltage level whereas the positive voltage value is reduced to below another voltage level.

The series linear regulating circuit 40 comprises a resistor dividing network (resistor bridge), e.g., R2 and R12, a MOSFET, e.g., M3 and a transistor Q1. The MOSFET may be an N-channel MOSFET. One of the resistors, e.g., R2 is connected to the positive line (rail). The same resistor is connected to the drain of M3. The source of M3 is connected to the logic line (rail). Another of the resistors, e.g., R12, is connected to the drain of M3 as well as the gate of M3. The resistance of R12 is larger than the resistance of R2.

In an aspect of the disclosure, the MOSFET M3 is operated in the linear region. When a voltage builds' up at the gate of M3, proportional current is conducted through M3.

For example, current flows through resistors R2 and R12. Since R12 has a larger resistance than R2, voltage slowly builds up at the gate of the MOSFET M3. As a voltage is established at the gate, a small current can flow across MOSFET M3. As the voltage becomes larger, more current can flow across MOSFET M3. In another aspect of the disclosure, MOSFET M3 may be replaced with a bipolar junction transistor BJT.

The transistor Q1 may be a NPN bipolar junction transistor BJT. The base of transistor Q1 is connected to the logic line and the source of MOSFET M3 (as well as the logic line shunt regulating circuit 35) which will be described later. The collector of transistor Q1 is connected to resistor R12. The transistor Q1 is operating in the active region and acts as an amplifier. Thus, transistor Q1 operates as the feedback component of the series linear regulating circuit 40 which causes the logic voltage to remain stable.

For example, as the current into the base increases, more current can flow across the transistor Q1, e.g., from the collector to the emitter. This causes the voltage at the gate of MOSFET M3 to droop, which is turn lowers the current flowing across M3.

The resistance R2 is selected to allow current to flow quickly into the series linear regulating circuit 40.

The power supply 1 further comprises a logic line shunt regulating circuit 35. The logic line shunt regulating circuit 35 in conjunction with the series linear regulating circuit 40 controls the logic voltage. The logic line shunt regulating circuit 35 comprises an adjustable precision shunt regulator such as a TL431. The adjustable precision shunt regulator is connected to a resistor dividing network (resistor bridge), e.g., R4 and R5. The voltage at the cathode is proportional to the ratio of resistors R4/R5. Resistor R4 is connected to the logic line and connected to the reference terminal. Resistor R5 is connected to the reference terminal and the negative line. The cathode of the adjustable precision shunt regulator is connected to the emitter of transistor Q1. The anode of the adjustable precision shunt regulator is connected to the negative line.

The adjustable precision shunt regulator allows the current flowing across the same to varying to maintain the voltage at the logic line. For example, the emitter current $I_E$, is a sum of the base current $I_B$ and the collector $I_C$. Since, the adjustable precision shunt regulator is coupled to the emitter of the transistor Q1, the emitter current $I_E$ is seen at the cathode. Thus, the current flowing to the negative line changes as the emitter current changes, but the voltage at the logic line is maintained.

A capacitor C1 is connected between the logic line and the negative line for stability and buffering.

The power supply 1 further comprises a positive line shunt regulating circuit 45. The positive line shunt regulating circuit 45 regulates the positive voltage on the positive line. The positive line shunt regulating circuit 45 is similar to the logic line shunt regulating circuit 35 in that it comprises an adjustable precision shunt regulator such as a TL431. The adjustable precision shunt regulator is connected to a resistor dividing network (resistor bridge), e.g., R7 and R8. The voltage at the cathode is proportional to the ratio of resistors R7/R8 (regulated output voltage). Resistor R7 is connected to the positive line and connected to the reference terminal. Resistor R8 is connected to the reference terminal and to ground. The anode of the adjustable precision shunt regulator is connected to ground.

A capacitor C2 is connected between the positive line and ground for stability and buffering.

While FIG. 2 shows a resistance R13 feeding the positive line shunt regulating circuit 45, this resistance value may represent the internal resistance of the circuit board or traces.

The power supply 1 further comprises a negative line regulating circuit 50. The negative line regulating circuit 50 comprises a diode D2 and a resistor R1. As depicted, the diode D2 is a Schottky rectifier diode. The logic line feeds the negative line via diode D2 so that the negative lines effectively track the logic line. In another aspect of the disclosure, D2 may be a Zener diode. By using a Zener diode, the maximum negative voltage may be clamped to a specific value. In this configuration, the diode is reversed biased due to the higher voltage appearing on the logic than on the negative line.

In an aspect of the disclosure, the power supply 1 further comprises boost voltage circuit 20. The boost voltage circuit 20 comprises a half bridge rectifier, a resistor R15 and a capacitor C2. The half bridge rectifier comprises a diode D7. The half bridge rectifier is coupled to the secondary winding of the transformer, e.g., L3. The half bridge rectifier receives an AC voltage and converts the same to a DC voltage. Capacitor C3 acts as a smooth capacitor.

The boost voltage is referenced to the positive line.

The logic line is coupled to ground via a diode D1 and resistor R11. As depicted in FIG. 2, the diode D1 is a Schottky rectifier diode.

The power supply 1 further comprises surge protection and filtering 55. The surge protection and filtering 55 is provided by a plurality of resistors (e.g., R3, R9 and R10) and a capacitor (e.g., C4). Resistor R3 is connected between the positive line and ground. Resistor R9 is connected between the positive line and the negative line. Resistor R10 is connected between the negative line and ground and in parallel to capacitor C4.

Figure 3:
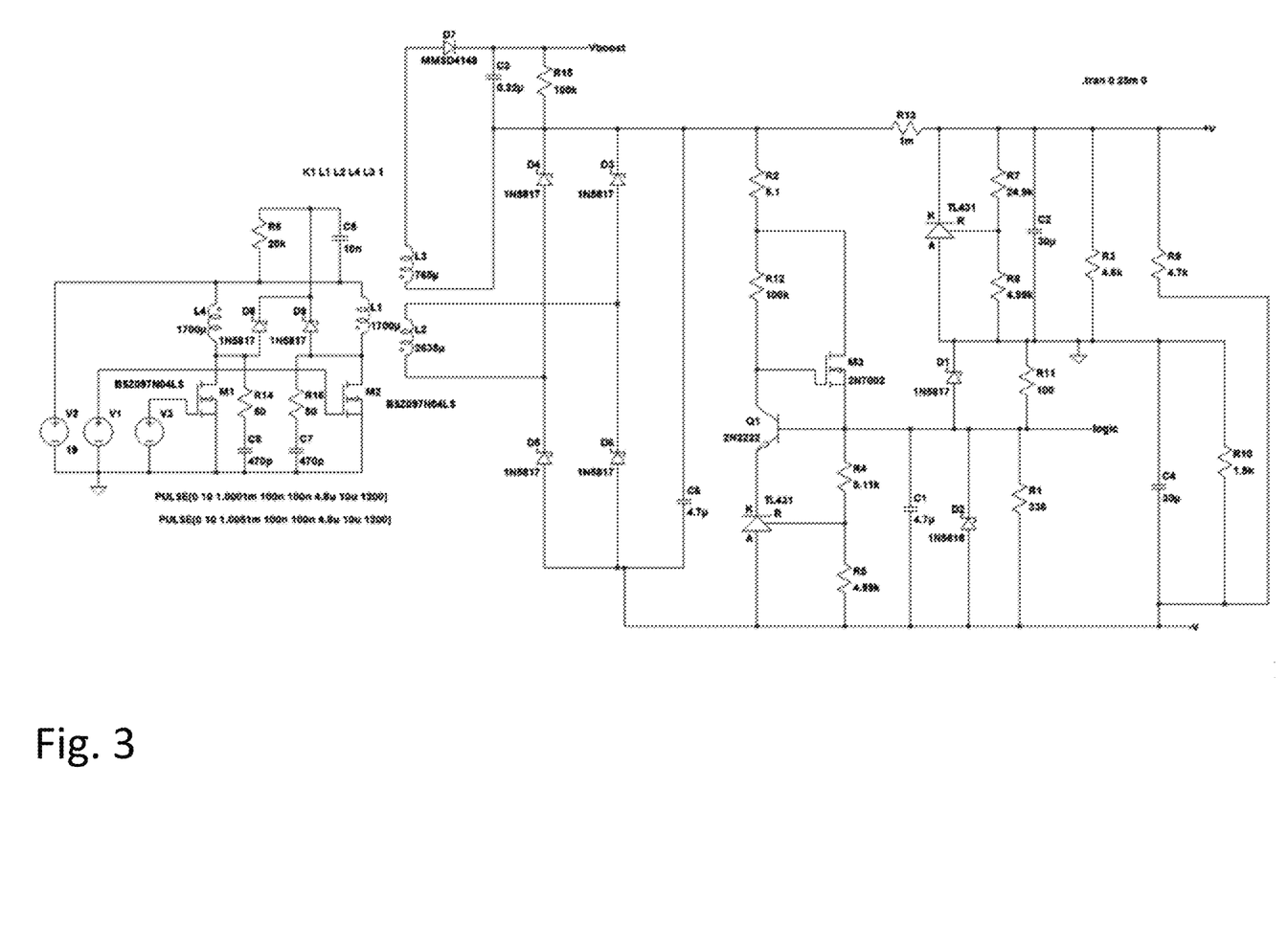
FIG. 3 is a schematic diagram of a gate driver power supply used in a simulation.

An example of the gate driver power supply 1 was simulated in pspice. FIG. 3 depicts the example of the gate driver power supply 1 which was simulated.

The input voltage V2 was 19V. 1 mΩ was used for R13. The following parameters were used for the pulsed signal V1 as shown on the below left of FIG. 3.

Initial Voltage=0V
Von=10V
Time delay=1.0001 ms
Time Rise=100 ns
Time Fall=100 ns
Time On=4.8 µs
Time period=10µ
Number of Cycles=1200.

The following parameters were used for the pulsed signal V3 as shown on the below left of FIG. 3.

Initial Voltage=0V
Von=10V
Time delay=1.0051 ms
Time Rise=100 ns
Time Fall=100 ns
Time On=4.8 µs
Time period=10µ
Number of Cycles=1200.

A different time delay was used to avoid a situation where both switches were ON at the same time.

The simulation parameter generates two complementary square waves.

The simulation was performed for 25 ms as shown in the top right of the drawing as "tran 0 25 ms 0".

Inductors L1 L2 L4 and L3 were treated as a transformer having a perfect coupling as indicated in the top left of the drawing "K1 L1 L2 L4 L3 1". While in the simulation, the coupling of the transformer was modeled as "perfect", in a circuit, a transformer would not have a "perfect" coupling.

The specific values for the resistance, capacitance and inductance are shown in FIG. 13.

Figure 4:
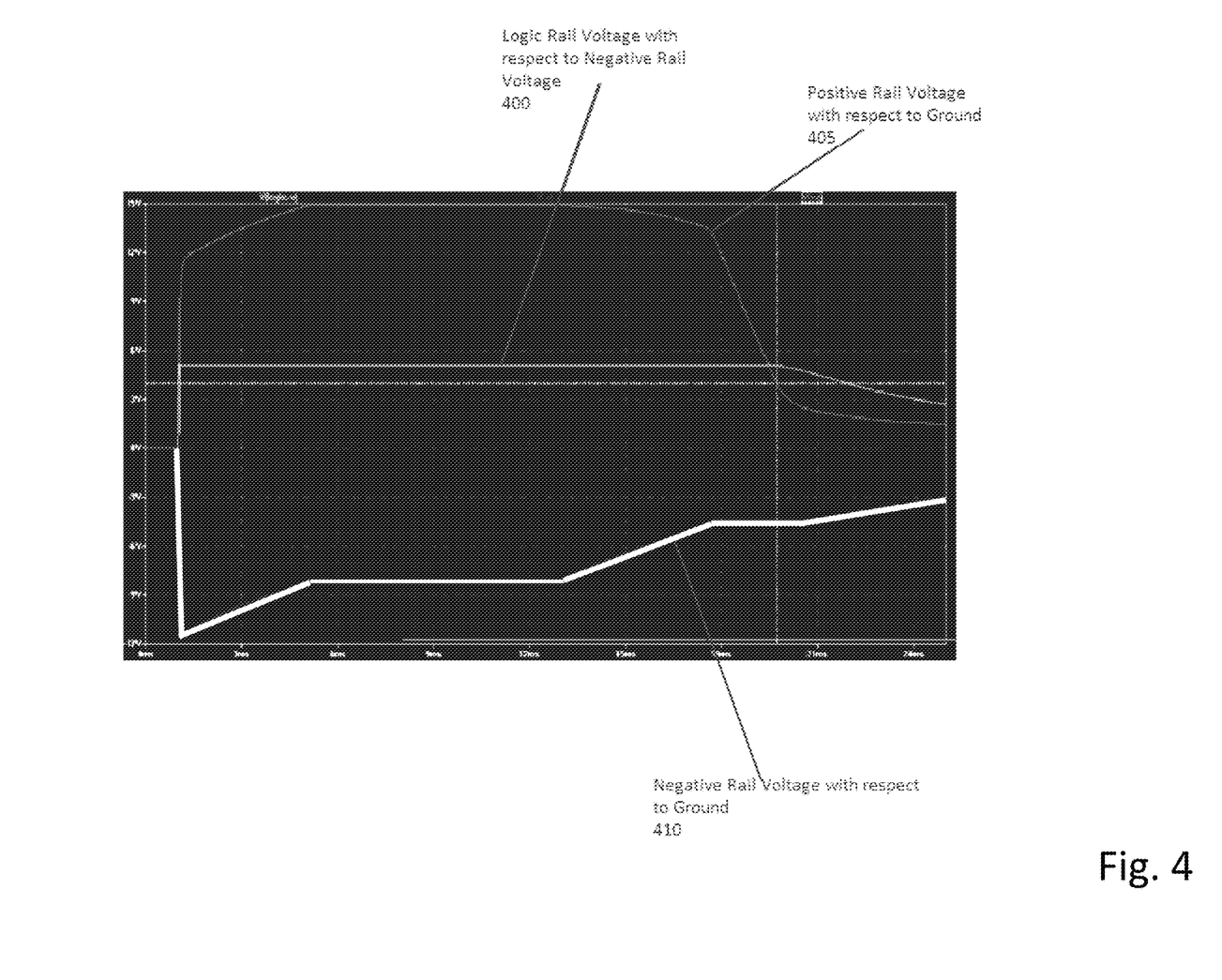
FIG. 4 illustrates the simulation results for the circuit in FIG. 3 includes showing a logic voltage, positive voltage and negative voltage over time.

FIG. 4 shows the results of the simulation. FIG. 4 is a plot showing the positive line (rail) voltage, negative line (rail) voltage and logic line (rail) voltage over time. The logic line (rail) voltage is with respect to the negative line (rail) voltage 400. Both the positive line (rail) voltage 405 and the negative line (rail) voltage 410 are with respect to ground.

As can be seen from FIG. 4, the steady state voltage (nominal) for the logic voltage is 5V. The steady state voltage (nominal) for the positive voltage is 15V and the steady state voltage (nominal) for the negative voltage is −8.7V.

Once the input voltage is turn on (V2 supplied), the logic line (rail) voltage 400 quickly reaches its steady state voltage of 5V (around 1 ms). However, it takes around 5 ms for the positive rail voltage to reach its steady state voltage of 15V (similar time for the negative line voltage).

The positive and the negative line voltages decay prior to the logic line changing voltage due to the series linear regulating circuit 40. For example, as shown, the logic line (rail) voltage 400 remains 5V until approximately 19.5 ms. A vertical line is shown where the logic line (rail) voltage starts to decrease. In contrast to the logic line (rail), the positive line (rail) voltage 405 experiences as steep decay just before 18 ms and drops below 4V when the logic line (rail) voltage 400 begins to drop. A horizontal line intersecting the vertical line shows the positive line (rail) voltage, when the logic line (rail) voltage starts to decrease.

Additionally, as can be seen in FIG. 4, when the logic line (rail) voltage 400 drops below 2V, which is after approximately 25 ms, the positive line (rail) voltage 405 is about 1.3V. 2V is a minimum guaranteed working voltage of certain circuit components of a gate driver circuit and accompanying circuitry. Also, 1.3V is below a gate threshold of most gated semiconductors. Thus, even in the presence of noise, a gated semiconductor will not turn ON.

Additionally, the use of the stored energy ensures that the gate is bias negatively as the stored gate drive energy decays.

Figure 5:
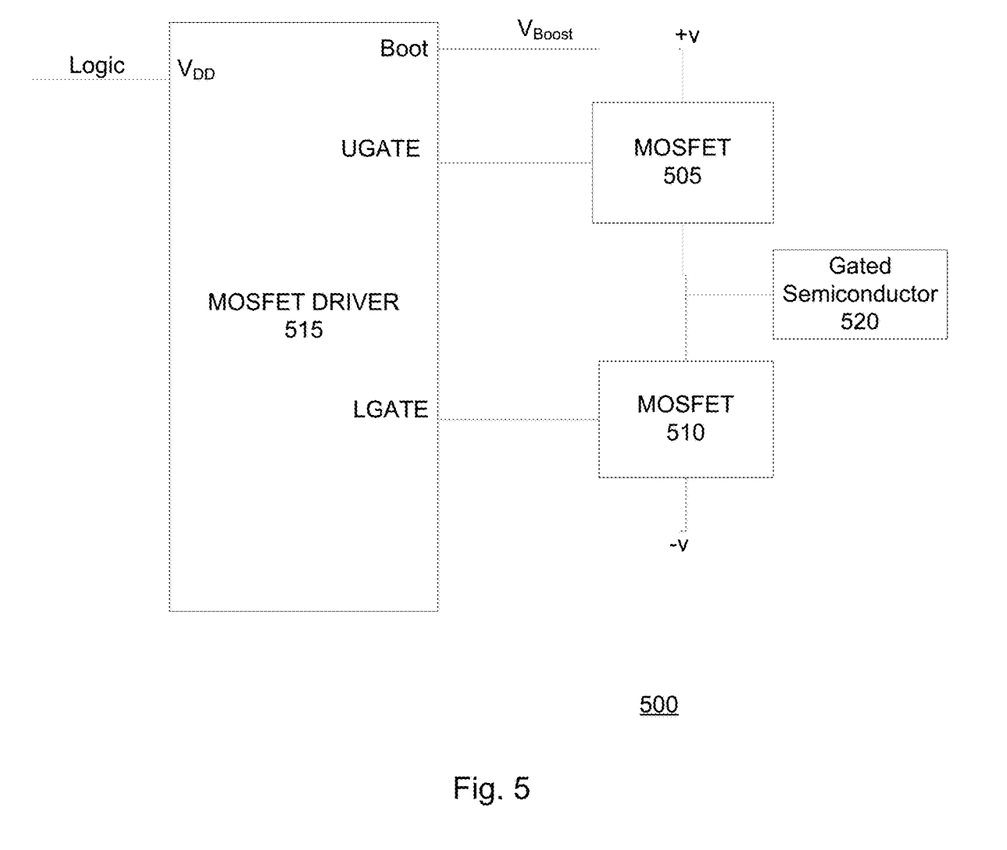
FIG. 5 illustrates a diagram showing a logic voltage, a positive voltage, a negative voltage and boost voltage coupled to a portion of an example of a gate driver circuit in accordance with aspects of the disclosure.

FIG. 5 illustrates a diagram showing the output voltages of the power supply 1 in accordance with aspects of the disclosure, coupled to a portion of an example of a gate driver circuit. The power supply 1 may be used with other gate driver circuits and this disclosure is not limited to the example of a gate driver circuit, a portion of which is depicted in FIG. 5.

As shown in FIG. 5, the example of a gate driver circuit 500 comprises a MOSFET gate driver 515 coupled to gated semiconductors, e.g., upper and lower MOSFETs 505/510. The phrase "coupled to" used herein refers to electrical communication and includes a direct connection or an indirect connection through other circuit components. In this configuration, the MOSFETs 505/510 are configured to act as switches and are driven by the MOSFET gate driver 515. The switching is controlled by control signal input into a PWM pin (not shown) of the MOSFET gate driver 515. The PWM signal may be issued from a controller via a digital isolator and other circuit components coupled to the PWM pin.

In an aspect of the disclosure, the MOSFET gate driver 515 may be a half-bridge driver, one such driver is TPS28225 (available from Texas Instruments, Inc.). The TPS28225 is a high-speed driver for N-channel complimentary driven power MOSFETS.

As depicted, the drain of the upper MOSFET 505 is coupled to a positive voltage (+v) and the source of the lower MOSFET 510 is coupled to a negative voltage source (−v). The positive and negative voltage is supplied by the gate driver power supply 1.

A gated semiconductor 520 is coupled between the upper MOSFET 505 and the lower MOSFET 510.

When the upper MOSFET 505 is turned ON, the lower MOSFET 510 is turned OFF (and vice versa). In certain states, both the upper MOSFET 505 and the lower MOSFET 510 may be OFF. The gate of the semiconductor 520 is charged via the upper MOSFET 505 by the positive voltage (+v) (when the upper MOSFET 505 is turned ON and the lower MOSFET 510 is turned OFF) and discharged through the lower MOSFET 510 to the negative voltage (-v) (when the upper MOSFET 505 is turned OFF and the lower MOSFET 510 is turned ON).

The gated semiconductor 520 is turned on when the gate/emitter voltage $V_{GE}$ exceeds the working threshold of the same.

The logic voltage from the gate driver power supply 1 is supplied to the MOSFET gate driver 515 as an input voltage $V_{DD}$. There may be other circuit components between the $V_{DD}$ pin of the MOSFET gate driver 515, and the input voltage $V_{DD}$ (logic voltage).

The MOSFET gate driver 515 has a rated voltage range for stable control of the gates of the upper and lower MOSFETs. The nominal value of the logic line and thus the input voltage $V_{DD}$ is greater than minimum value of the rated voltage range.

In accordance with aspects of the disclosure, since the logic line voltage increases quickly to the steady state value, e.g., 5V, prior to the positive line voltage (+v), the TPS 28225 (example of the driver 515) become stable to control the gated semiconductors (MOSFETS 505/510). In other words, unintentional turn on of MOSFET 505, which in turn would unintentionally turn on the gated semiconductor 520 is avoided.

In an aspect of the disclosure, depending on the size of the gated semiconductor being driven, e.g., 505/510 and 520, a boost voltage $V_{Boost}$ is coupled to the floating bootstrap supply pin of the MOSFET gate driver 515. The boost voltage $V_{Boost}$ helps turn on the gated semiconductor, as needed. A capacitor (not shown) may be added between the Boot pin and a phase pin (not shown). The phase pin (not shown) may also be coupled to the source of the upper MOSFET 505 and the drain of the lower MOSFET 510.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A gate driver power supply for outputting a positive voltage, a negative voltage and a logic voltage, the gate driver power supply comprising:
    a power source coupled to a primary winding of a transformer via at least two complementary switches;
    a full bridge rectifier coupled to a secondary winding of the transformer;
    a first shunt regulating circuit coupled to a logic supply line and the full bridge rectifier;
    a series linear regulating circuit coupled to the logic supply line, the first shunt regulating circuit and the full bridge rectifier, the first shunt regulating circuit and the series linear regulating circuit regulating the logic voltage on the logic supply line;
    a second shunt regulating circuit coupled to the full bridge rectifier, a ground and a positive voltage line; and
    a diode having a first terminal coupled to the logic supply line and a second terminal coupled to a negative supply line.

2. The gate driver power supply of claim 1,
    wherein the series linear regulating circuit comprises a transistor, a first resistive divider and a MOSFET or a bipolar junction transistor (BJT), the base of the transistor is coupled to the logic supply line, the collector of the transistor is coupled to the gate of the MOSFET or base of the BJT, and
    wherein the source of the MOSFET or the emitter of the BJT is coupled to the logic supply line.

3. The gate driver power supply of claim 2, further comprising a first capacitor coupled to output terminals of the full bridge rectifier.

4. The gate driver power supply of claim 3, wherein the first shunt regulating circuit comprises a first shunt regulator, a second resistive divider and a second capacitor, the cathode of the first shunt regulator being coupled to the emitter of the transistor, the anode of the first shunt regulator coupled to the negative supply line, the first capacitor and full bridge rectifier, the second resistive divider comprising a first resistor and a second resistor connected in series, the first resistor having a first end and a second end, the second resistor having a third end and a fourth end, the first end being coupled to the logic supply line, the second end being coupled to the reference terminal of the first shunt regulator and the third end of the second resistor, the third end of the second resistor further being coupled to the reference terminal of the first shunt regulator and the fourth end being coupled to the negative supply line, the second capacitor being coupled to the logic supply line and the negative supply line.

5. The gate driver power supply of claim 4, wherein the first resistive divider comprises a third resistor and a fourth resistor is series, the third resistor having a fifth end and a sixth end, the fourth resistor having a seventh end and an eighth end, the fourth end being coupled to the positive supply line, the first capacitor and full bridge rectifier, the fifth end being coupled to the drain of the MOSFET or the collector of the BJT and the seventh end of the fourth, the seventh end of the fourth resistor further being coupled to the drain of the MOSFET or collector of the BJT and the eighth end being coupled to the gate of the MOSFET or base of the BJT and collector of the transistor.

6. The gate driver power supply of claim 5, wherein the second shunt regulating circuit comprises a second shunt regulator, a third resistive divider and a third capacitor, the cathode of the second shunt regulator being coupled to the positive supply line, the anode of the second shunt regulator coupled to the ground,
    the third resistive divider comprising a fifth resistor and a sixth resistor connected in series, the fifth resistor having a ninth end and a tenth end, the sixth resistor having a eleventh end and a twelfth end, the ninth end being coupled to the positive supply line, the tenth end being coupled to the reference terminal of the second shunt regulator and the eleventh end of the sixth resistor, the eleventh end of the second resistor further being coupled to the reference terminal of the second shunt regulator and the twelfth end being coupled to the ground, the third capacitor being coupled to the positive supply line and the ground.

7. The gate driver power supply of claim 5, wherein the gate driver power supply further outputs a boost voltage.

8. The gate driver power supply of claim 7, wherein the gate driver power supply supplies power to a gate driver circuit, the gate driver circuit comprising a driver, a first gated semiconductor and a second gated semiconductor, the first gated semiconductor and the second gated semiconductor being connected in series, a gate of the first gated semiconductor being coupled to a first gate pin of the driver, a gate of the second gated semiconductor being coupled to a second gate pin of the driver, wherein the logic voltage is coupled to a $V_{DD}$ pin of the driver, the positive voltage is coupled to a drain of the first gated semiconductor and the negative voltage is coupled to the source of the second gated semiconductor.

9. The gate driver power supply of claim 7, wherein the boost voltage is coupled to a bootstrap pin of the driver.

10. The gate driver power supply of claim 9, wherein when the gate driver circuit is powered by the gate driver power supply, the gate driver circuit is configured to charge a gate of a gated semiconductor by switching the first gated semiconductor on and the second gated semiconductor r off and discharge the gate of the gated semiconductor by switching the second gated semiconductor on and the first gated semiconductor off.

11. The gate driver power supply of claim 1, wherein the diode is a Zener diode.

12. The gate driver power supply of claim 1, wherein the secondary winding of the transformer comprises a first winding and a second winding, and wherein the gate driver power supply further comprises a boost voltage generating circuit, the boost voltage generating circuit comprising the second winding, a second diode coupled to the second coil and a capacitor.

13. The gate driver power supply of claim 1, wherein the primary winding of the transformer comprises a first winding and a second winding, the first winding and the second winding having opposite polarity.

14. The gate driver power supply of claim 1, further comprising a surge suppression circuit coupled to the positive voltage line and the negative voltage line.

15. The gate driver power supply of claim 1, wherein the series linear regulating circuit is configured such that the logic voltage becomes a steady-state voltage prior to the positive voltage becoming a steady-state voltage.

16. The gate driver power supply of claim 1, wherein the gate driver power supply is configured such that the logic voltage remains above a first voltage value until the positive voltage is less than a second voltage value.

* * * * *